United States Patent

[11] 3,632,036

[72] Inventor William M. Halstead
P. O. Box 881, Glen Burnie, Md. 21061

[21] Appl. No. 862,166
[22] Filed Sept. 30, 1969
[45] Patented Jan. 4, 1972

[54] ELECTRICAL COMPONENT DESOLDERING AND EXTRACTING TOOL
4 Claims, 2 Drawing Figs.

[52] U.S. Cl. .......... 228/54, 126/263, 219/229
[51] Int. Cl. .......... B23k 3/02
[50] Field of Search .......... 228/51, 52, 53, 54; 219/229; 126/263

[56] References Cited

UNITED STATES PATENTS

| | | | |
|---|---|---|---|
| 3,529,760 | 9/1970 | Hickman et al. | 228/54 X |
| 3,516,142 | 6/1970 | De Rose et al. | 29/203 |
| 3,323,023 | 5/1967 | Walker | 317/101 |
| 3,260,439 | 7/1966 | Tambasco | 228/55 |
| 3,084,649 | 4/1963 | Parstorfer | 228/52 X |
| 3,050,612 | 8/1962 | Eversole | 228/51 X |
| 2,622,319 | 12/1952 | Hunt | 30/140 X |
| 2,234,129 | 3/1941 | Pfeil | 30/140 |

*Primary Examiner*—John F. Campbell
*Assistant Examiner*—R. J. Craig
*Attorneys*—Munson H. Lane and Munson H. Lane, Jr.

ABSTRACT: A shank which is adapted to be connected to and heated by a soldering iron carries a metallic plate provided integrally at its opposite side edges with rows of downwardly projecting fingers. When the tool is applied to an electrical component such as an integrated circuit module on a printed circuit board, the fingers contact metallic terminals at opposite side edges of the module and heat is transferred to the connector pins of the terminals for melting solder on the pins without applying heat directly to the pins themselves. The plate is also equipped with resilient flanges and detents to engage the underside of the module and extract the same from the printed circuit board when the solder is melted.

PATENTED JAN 4 1972 3,632,036

INVENTOR
William M. Halstead

BY Munson H. Lane
ATTORNEY

ELECTRICAL COMPONENT DESOLDERING AND EXTRACTING TOOL

This invention relates to new and useful improvements in special tools for use in the electronic industry, and the principal object of the invention is to facilitate convenient and expeditious removal of an electrical component such as an integrated circuit module from a printed circuit board under conditions when it is not feasible to desolder the connector pins of the module by application of heat directly to the pins.

Such conditions are found in instances where, for example, insulated wires are located close to the pins and application of heat directly to the pins could possibly damage the insulation on such wires. As another example, the underside of the printed circuit board where the connector pins are soldered may not be readily accessible for application of heat directly to the pins.

The invention overcomes these difficulties by providing a special tool which is adapted to be attached to and heated by a conventional soldering iron, and which may be applied to an integrated circuit module on the usually accessible top side of a printed circuit board in such manner that, without affecting the module itself, heat is transferred through the terminals of the module to the connector pins and solder on the pins at the underside of the board is melted to facilitate removal of the module.

As another important feature, the tool of the invention has means for engaging the underside of the module so that it may be extracted from the board by an application of a pulling force to the tool while the solder is in the molten condition.

Figure 1:
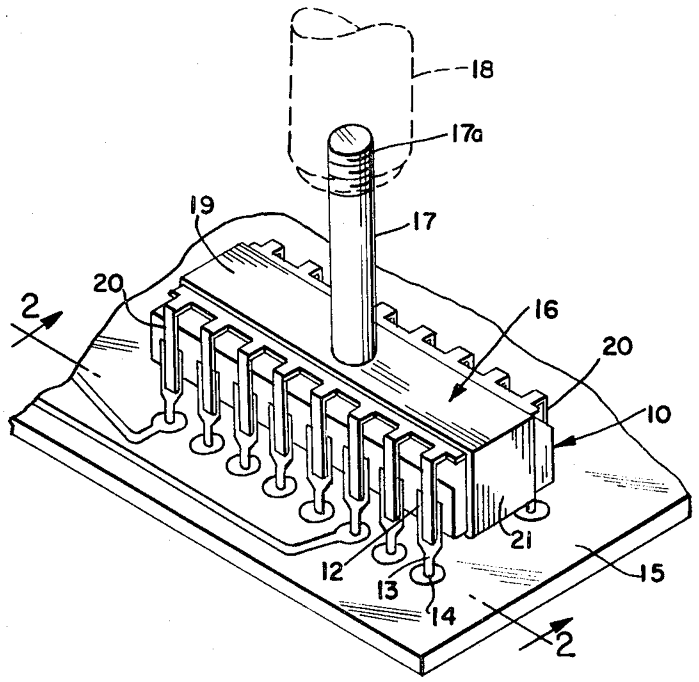
Figure 2:
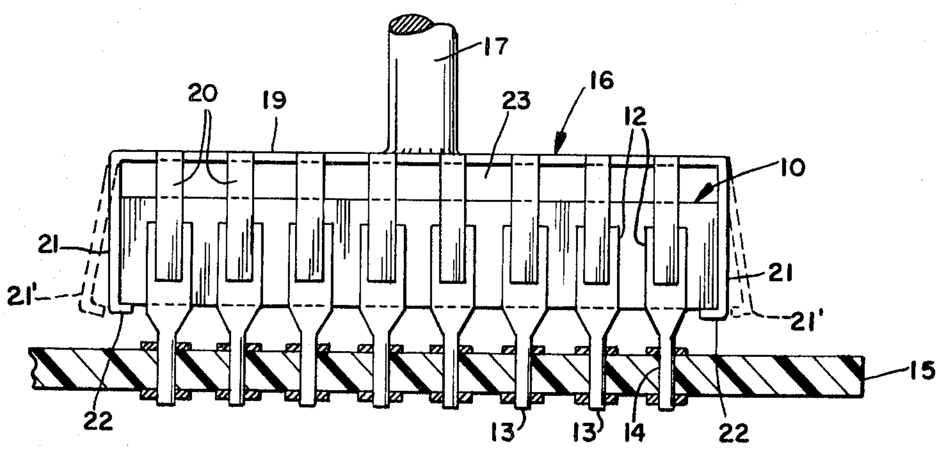

With the foregoing more important object and features in view, the invention will be understood from the following description taken in conjunction with the accompanying drawings, wherein like characters of reference are used to designate like parts, and wherein:

FIG. 1 is a perspective view showing the desoldering and extracting tool of the invention applied to an integrated circuit module on a printed circuit board; and FIG. 2 is an enlarged vertical sectional view, taken substantially in the plane of the line 2—2 in FIG. 1.

Referring now to the accompanying drawings in detail, the numeral 10 generally designates an integrated circuit module which is provided along its opposite side edges with rows of metallic terminals 12 having connector pins 13 extending downwardly therefrom through eyelet holes 14 in a printed circuit board 15, it being understood that the module 10 is usually installed on top of the board and that the connector pins 13 are soldered to the printed circuit at the underside of the board.

When the module 10 becomes defective or for some other reason is to be removed from the board 15, the connector pins 13 must be desoldered which is usually done by application of heat directly to the pins. However, since this must be done at the underside of the board, application of heat directly to the pins is not feasible when the underside of the board is not readily accessible. Also, in some instances insulated wires pass close to the pins and application of heat directly to the pins could very likely damage the insulation on such wires.

The invention provides a special tool, designated generally by the numeral 16, whereby the desoldering operation may be effected from the top side of the board 15. As such, the tool transfers heat to the terminals 12 or the module and through the terminals to the connector pins 13, so that application of heat directly to the pins is not necessary.

The special tool 16 comprises a shank 17 having a screw-threaded end portion **17*a* for connection to a conventional soldering iron, a portion of which is indicated by the dotted lines 18. The other end of the shank 17 is secured to a metallic plate 19 which is normal to the shank and is provided along its opposite side edges with rows of spaced, downwardly projecting fingers 20. The arrangement is such that when the tool is applied to the module 10, the module is received between the two rows of fingers 20 and the fingers frictionally contact the respective terminals 12** of the module, as will be clearly apparent from the drawings.

Thus, when the tool is heated and applied to the module, heat will be transferred through the fingers 20 and through the module terminals 12 to the connector pins 13, whereby solder around the pins at the underside of the board 15 will be melted and removal of the module from the board will thus be facilitated. The fingers 20 have some degree of inherent resiliency and their frictional contact with the module terminals 12 may be sufficient to extract the module from the printed circuit board by a pulling force applied to the tool shank 17 while the solder at the connector pins 13 is melted.

However, to provide a more positive extraction, the opposite ends of the plate 19 are preferably formed with downturned flanges 21 which are equipped at their lower edges with inturned lips or detents 22 for engaging the underside of the module 10 as shown by the full lines in FIG. 2, so that the module may be positively withdrawn from the board 15. The flanges 21 are resiliently flexible, so that they may be sprung away from the ends of the module as shown by the dotted lines 21', whereby to disengage the detents 22 from the underside of the module when the latter has been withdrawn from the board and is to be separated from the tool.

Preferably, the vertical dimension of the flanges 21 is such that the downward spacing of the detents 22 from the plate 19 is greater than the vertical dimension of the module 10, so that when the detents 22 engage the underside of the module, a space exists between the top of the module and the underside of the plate 19, as indicated at 23. This space is open to the atmosphere through the spaces existing between the fingers 20 in each row, and thus sufficient air circulation is provided to safeguard the module itself against damage by heat from the tool.

What is claimed as new is:

1. A tool for use in desoldering and extracting from a printed circuit board an integrated circuit module which has rows of metallic terminals at opposite side edges thereof and connector pins extending downwardly from said terminals below the underside of the module; said tool comprising a shank adapted to be connected to and heated by a soldering iron, a metallic plate secured to an end of said shank, and rows of spaced resilient fingers formed integrally with and extending downwardly from opposite side edges of said plate, said rows of fingers being spaced apart sufficiently to receive the module therebetween and to frictionally contact the rows of module terminals with individual fingers juxtaposed against individual terminals whereby to transfer heat through the terminals to their connector pins for melting solder on the latter while the module is in position on the printed circuit board.

2. A tool for use in desoldering and extracting from a printed circuit board an integrated circuit module which has rows of metallic terminals at opposite side edges thereof and connector pins extending downwardly from said terminals below the underside of the module; said tool comprising a shank adapted to be connected to and heated by a soldering iron, a metallic plate secured to an end of said shank, and rows of fingers formed integrally with and extending downwardly from opposite side edges of said plate, said rows of fingers being adapted to receive a module therebetween and to frictionally contact the rows of module terminals whereby to transfer heat through the terminals to their connector pins for melting solder on the latter while the module is in position on a printed circuit board together with downturned flanges provided at opposite ends of said plate and inturned detents provided at lower edges of said flanges for engaging the underside of a module whereby the latter may be extracted from a printed circuit board by pulling force applied to said shank, said flanges being resiliently flexible to permit disengagement of said detents from the underside of the module when the latter is to be separated from the tool.

3. The tool as defined in claim 2 which is further characterized in that the vertical dimension of said flanges is such that said detents are spaced downwardly from said plate by a distance greater than the vertical dimension of a module, whereby a space may exist between the top of the module and the plate when the module is engaged at its underside by said detents.

4. The tool as defined in claim 3 which is further characterized in that said space between the top of the module and said plate is open to the atmosphere through spaces existing between said fingers in each row.

* * * * *